United States Patent

Iijima

[15] 3,639,812

[45] Feb. 1, 1972

[54] MECHANOELECTRICAL TRANSDUCER HAVING A PRESSURE APPLYING PIN FIXED BY METALLIC ADHESION

[72] Inventor: Yasuo Iijima, Kobe, Japan

[73] Assignee: Matsushita Electric Industrial Co., Ltd., Kadoma-shi, Osaka, Japan

[22] Filed: Dec. 2, 1969

[21] Appl. No.: 881,383

[30] Foreign Application Priority Data

Dec. 4, 1968 Japan....................................43/89780

[52] U.S. Cl......................317/234 R, 317/234 J, 317/234 L, 317/234 M, 317/235 R, 317/235 M, 317/235 UA

[51] Int. Cl..........................................H01l 3/00, H01l 5/00

[58] Field of Search...................317/234, 235, 5, 5.2, 26, 31; 179/100.41 T, 101, 102, 103

[56] References Cited

UNITED STATES PATENTS

| | | | |
|---|---|---|---|
| 2,929,885 | 3/1960 | Mueller | 317/235 X |
| 3,290,127 | 12/1966 | Kahng et al. | 317/235 X |
| 3,295,085 | 12/1966 | Nelson | 317/234 X |
| 3,432,732 | 3/1969 | Shibata et al. | 317/235 |
| 3,443,041 | 5/1969 | Kahng et al. | 317/235 X |
| 3,512,054 | 5/1970 | Owada et al. | 317/235 |
| 3,240,962 | 3/1966 | White | 317/235 |
| 3,458,778 | 7/1969 | Genzabella et al. | 317/234 |
| 3,466,459 | 3/1971 | Rindner | 29/588 |

FOREIGN PATENTS OR APPLICATIONS

| | | | |
|---|---|---|---|
| 1,453,546 | 10/1966 | France | 317/235 |

*Primary Examiner*—John W. Huckert
*Assistant Examiner*—Andrew J. James
*Attorney*—Stevens, Davis, Miller & Mosher

[57] ABSTRACT

In a transducer utilizing the pressure-sensitive property of a semiconductor, a pin for applying pressure is adhered onto a pressure-sensitive portion of the semiconductor by the metallization of the surface of the pin and the semiconductor body. Using this means, the pressure application pin is prevented from moving except in contact with a small portion, thereby enhancing the lifetime and stability of the device.

5 Claims, 2 Drawing Figures

PATENTED FEB 1 1972

3,639,812

INVENTOR

YASUO IIJIME

BY

Stevens, Davis, Miller & Mosher
ATTORNEYS

MECHANOELECTRICAL TRANSDUCER HAVING A PRESSURE APPLYING PIN FIXED BY METALLIC ADHESION

This invention relates to a semiconductor mechanoelectrical transducer.

In semiconductor mechanoelectrical transducers, pressure can be applied to a semiconductor body in various ways. One effective way is to use a pin of an ultrahard material which has an extremely small radius of curvature at its tip portion. For example, pins of sapphire, diamond, ultrahard alloy, etc., are used. However, when pressure is applied to a semiconductor body through such a pin, minute movements of the pin point with respect to the semiconductor body occur thereby reducing the stability of the electrical properties and accelerating deterioration of the semiconductor even if the pin is fixed on the semiconductor body with plastic.

An object of this invention is to overcome the described disadvantage.

According to this invention, the tip of a pin is fixed onto a semiconductor body by metallizing the contacting portions of the pin and the semiconductor body, thereby avoiding any unstability of the tip of the pin with respect to the semiconductor body itself.

Namely, a fluxible metal of good adhesion is preliminarily coated on a pressure application pin made of sapphire, diamond, or ultrahard alloy, etc., by chemical or vapor deposition. Similarly, such metal is also coated on a semiconductor body in the portion that will make contact with the pin. These metals are not necessarily the same. For example when a sapphire pin having a radium of curvature of 50 $\mu$ at its tip portion is used to apply pressure to a PN-junction surface or a Schottky electrode of a silicon body, films of chromium and a tin-lead alloy are coated on the sapphire pin and films of chromium and gold are coated onto the application surface of the silicon body. Here, chromium is used to enhance the adhesion with the semiconductor body and the pin although other metals such as nickel, aluminum, etc., can equally be used for this purpose. Regarding the combination of a tin-lead alloy and gold, other combinations may also be used if they afford good adhesion when fused.

After these treatments, the pin and the semiconductor are brought into contact, pressed firmly together and then subjected to fusing treatment by heating.

Figure 1:
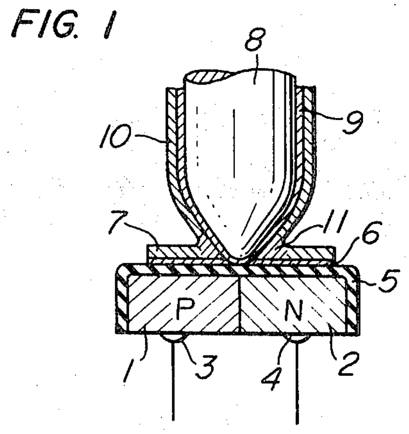
Figure 2:
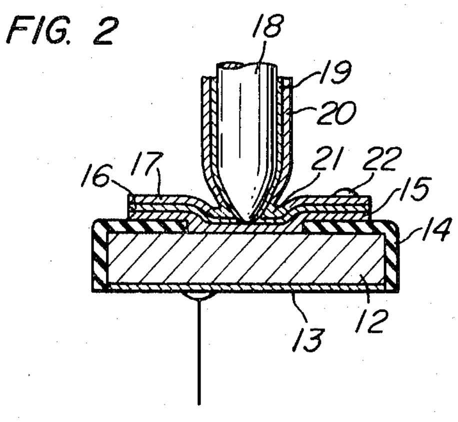

Now, the embodiments of the invention will be described in connection with the accompanying drawings in which:

FIG. 1 is a cross section of an embodiment of a semiconductor mechanoelectrical transducer of the invention; and FIG. 2 is a cross section of another embodiment of a semiconductor mechanoelectrical transducer of the invention.

In FIG. 1, a transducer comprises a P-type semiconductor 1, for example, of silicon, an N-type semiconductor 2, for example, of silicon, forming a PN-junction with the P-type semiconductor, electrodes 3 and 4 respectively provided on the P- and N-type semiconductors 1 and 2. The semiconductor body 1 and 2 is covered with an insulating film 5 such as of silicon oxide, and a fairly strong adhesive film 6 of chromium, etc. On this chromium film 6, a fusible metal film 7 such as of gold is formed for fixing a pin 8. A pin 8, such as of sapphire, for applying a pressure to the semiconductor is coated with a strongly adhesive film 9 such as of chromium and a fusible metal film 10 such as of a tin-lead alloy. The pin 8 and the semiconductor body 1 and 2 are brought into contact and adhered to each other by fusing the metal films 7 and 10 to form a fused portion 11.

FIG. 2 shows another embodiment of a semiconductor mechanoelectrical transducer in which a pressure application pin is fixed on a Schottky electrode provided on a silicon body. A semiconductor body 12 such as of silicon is provided with an ohmic electrode 13, an insulating film 14 such as of silicon oxide and a Schottky electrode 15. On the Schottky electrode 15, a strongly adhesive film 16 such as of chromium and a fusible metal film 17 such as of gold are coated for fixing a pin. A pressure application pin 18 such as of sapphire is also coated with a strongly adhesive film 19 such as of chromium and a fluxible metal film 20 such as of a lead-tin alloy. The pin 18 is fixed to the semiconductor body 12 at a fused portion 21. Numeral 22 indicates an electrode.

As is stated above, a pressure application pin is fixed on a semiconductor body by metallic adhesion in this invention. Thus, the adhesion and fixing of a pin is more stably carried out than by the conventional method such as by using plastic, resulting in an enhancement of the stability of the electrical properties and the service life of the device. Further, sufficient adhesion is obtained with a smaller contact portion by an appropriate selection of the metal material so that the loss of applied force is limited to be small, enabling to apply almost the same pressure to a semiconductor body as that of the case of no fixing medium. Thus, the invention has various large industrial merits.

What is claimed is:

1. A semiconductor mechanoelectrical transducer comprising (a) a semiconductor body having a contact portion, a first adhesive film affixed to said semiconductor body, and a first fusible metal film coated on said first adhesive film, and (b) a pin fixed to the contact portion of said semiconductor body for applying pressure to said contact portion, a second adhesive film affixed to said pin, and a second fusible metal film coated on said second adhesive film, said first and second fusible metal films fusing together when said pin and the contact portion of said semiconductor body are pressed together.

2. A semiconductor mechanoelectrical transducer according to claim 1 wherein an insulating film is interposed between said semiconductor body and said first adhesive film.

3. A semiconductor mechanoelectrical transducer according to claim 1 wherein a Shottky electrode is interposed between said semiconductor body and said first adhesive film.

4. A semiconductor mechanoelectrical transducer according to claim 1 wherein said first and second adhesive films are composed of materials selected from the group consisting of chromium, nickel and aluminum and said first and second fusible metal films are composed of materials selected from the group consisting of lead-tin alloy and gold.

5. A semiconductor mechanoelectrical transducer according to claim 1 wherein said first and second adhesive films are composed of chromium, said first fusible metal film of gold and said second fusible metal film of lead-tin alloy.

* * * * *